United States Patent [19]

Quattrini et al.

[11] Patent Number: 4,891,789

[45] Date of Patent: Jan. 2, 1990

[54] SURFACE MOUNTED MULTILAYER MEMORY PRINTED CIRCUIT BOARD

[75] Inventors: Victor L. Quattrini, Westford; Edwin P. Fisher, Abington, both of Mass.

[73] Assignee: Bull HN Information Systems, Inc., Billerica, Mass.

[21] Appl. No.: 163,682

[22] Filed: Mar. 3, 1988

[51] Int. Cl.⁴ ............................ G11C 5/02; H05K 3/30
[52] U.S. Cl. ........................................ 365/63; 365/72; 361/409; 174/68.5
[58] Field of Search ............... 361/412, 414, 403, 418, 361/404, 406, 409, 400; 365/51, 63, 72; 174/52.4, 68.5

[56] References Cited

U.S. PATENT DOCUMENTS 4,190,901 2/1980 Johnson et al. ........................ 365/72
4,651,416 3/1987 DePaul ........................... 174/68.5 X
4,692,900 9/1987 Ooami et al. .......................... 365/63

*Primary Examiner*—Joseph A. Popek
*Attorney, Agent, or Firm*—Faith F. Driscoll; John S. Solakian

[57] ABSTRACT

A multilayer printed circuit memory board is designed and constructed so that the top and bottom layers contain repetitive integrated circuit (IC) chip component hole/pad and interconnection line patterns which are mirror images of one another. The board uses surface mounted techniques in which the integrated chip components of the memory array are mounted and soldered to both sides of the board thereby doubling the density or capacity of the memory board. The integrated circuit memory chips, mounted on the top and bottom of the board, are aligned with each other for sharing common holes or vias in which logically equivalent input signal connections are exchanged in a manner for reducing the number of holes and length of connective wiring.

18 Claims, 5 Drawing Sheets

SURFACE MOUNTED MULTILAYER MEMORY PRINTED CIRCUIT BOARD

BACKGROUND OF THE INVENTION

Field of Use

The present invention relates to multilayer printed circuit boards and more particularly to the construction of multilayer printed circuit boards using surface mount technology.

Prior Art

The processes for producing complex multilayer printed circuit boards are well known in the art. An example is disclosed in U.S. Pat. No. 4,495,479.

In such multilayer printed circuit boards, the IC components in various dual in-line packages are set into holes drilled into the boards and soldered to signal conductors on different layers through the plated through holes. Various techniques, including fine line technology, have been used for increasing the number of lines or connections per square inch. However, this results in cost increases. Furthermore, there are limitations on the number of components which can be mounted on the board surface because of the spacing requirements between components and hole sizes.

The advent of surface mount technology allows IC components to be soldered to pads which are on the board's surface. Because surface mounted component packages are smaller than DIPs and do not require large holes for mounting, more such components can be mounted on the surface of the board. This results in increased board density. Since the components are mounted on the surface of the board, surface mount technology also permits IC components to be mounted on both sides of the board.

While surface-mount technology allows for greater flexibility in circuit boards, it becomes difficult to provide the proper interconnection between such components when they are mounted on both sides of the board. Furthermore, because of the greater such density of components on boards, testing is complicated due to the increase in the number of leads. This can give rise to new test equipment requirements, resulting in cost increases.

Accordingly, it is a primary object of the present invention to provide a multilayer printed circuit board design which uses surface mount technology without a substantial increase in board layout complexity.

It is a further object of the present invention to provide a multilayer printed circuit board design which uses surface mount technology and is compatible with standardized testing equipment.

SUMMARY OF THE INVENTION

The above objects are achieved in a preferred embodiment of the multilayer printed circuit memory board designed and constructed so that the top and bottom layers contain repetitive integrated circuit (IC) chip hole or pad and interconnect line patterns which are mirror images of each other. The preferred embodiment of the board is constructed using surface mounted technology in which the components are mounted on the board's surfaces on both sides which doubles the density of the memory board.

According to the invention, a grid is selected which is compatible with standard testing requirements. More specifically, in the preferred embodiment, a hole grid of 0.100 inches is utilized. This permits the placement of vias or holes on 0.100 inch centers which eliminates the need for additional test points and special ring out fixtures.

The number of vias or holes required to access the internal layers of the multilayer board are reduced by sharing common vias between paired top and bottom IC components which carry logically equivalent signals. The vias or holes are distributed in rows along the grid lines so that there are substantially equal numbers in each row. This simplifies internal connections by reducing the number and distances. It also permits a reduction in the number of layers required for interconnections.

In the preferred embodiment, the surface mounted components are high density memory chips. Each such chip is connected to receive a number of address signals. The invention recognizes that notwithstanding the assignment of unique address designations, certain sets of address signals may be treated as logical equivalents based upon an operational characteristic of such memory chips. This characteristic is that the set of input addresses may be scrambled without affecting the normal operation of the devices. The logically equivalent address signals are exchanged so as to simplify the top and bottom layer patterns and to reduce the number of vias or holes as mentioned above.

By designing and producing a multilayer memory board as described above, it is possible to utilize existing technology in the development of high density memory systems. Also, the same standard multilayer printed circuit board design can provide a wide range of densities through the use of memory pacs or memory daughter boards designed and constructed according to the present invention to accommodate high density memory array chips.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIG. 7 is a top view of another DRAM integrated circuit package of the IC which populates a multilayer printed circuit board designed using the cell pattern of FIG. 6.

DESCRIPTION OF THE PREFERRED EMBODIMENT

Figure 1:
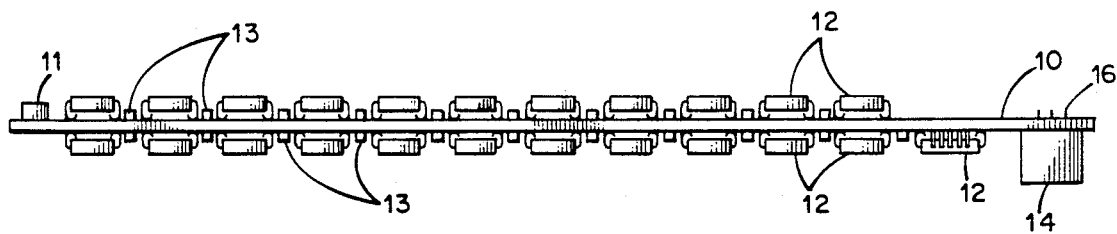
FIG. 1 is a perspective view of a multilayer printed circuit board designed and produced according to the teachings of the present invention.

With reference to FIG. 1, a multilayer printed circuit board designed and produced according to the teachings of the present invention will now be described. As seen from FIG. 1, the multilayer board 10 of the preferred embodiment consists of eight layers constructed using standard multilayer techniques with the exception of the top and bottom layers. These layers are constructed using surface mounted technology. That is, the electrical integrated circuit components 12 are affixed to the top and bottom surfaces of board 10 by means of surface pads which are soldered to the board surfaces. Also, filter capacitors 13 are surface-mounted between each row of components 12 on both sides of board 10. An additional pair of filter capacitors 11 are surface-mounted to the top surface of board 10. Additionally, board 10 includes a number of holes or vias which are constructed using plated through hole multilayer board technology. A pin and socket connector 14 is mounted on the bottom of board 10 by press fitting the connector pins 16 into plated through holes in the board eliminating the need for soldering.

Figure 2:
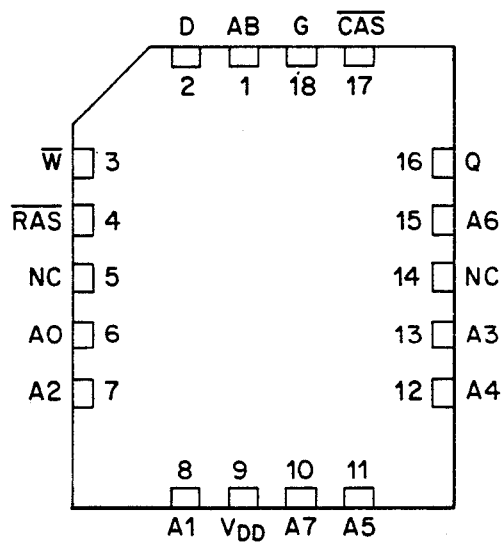
FIG. 2 shows the top artwork pattern for producing the multilayer board of FIG. 1.
Figure 2:
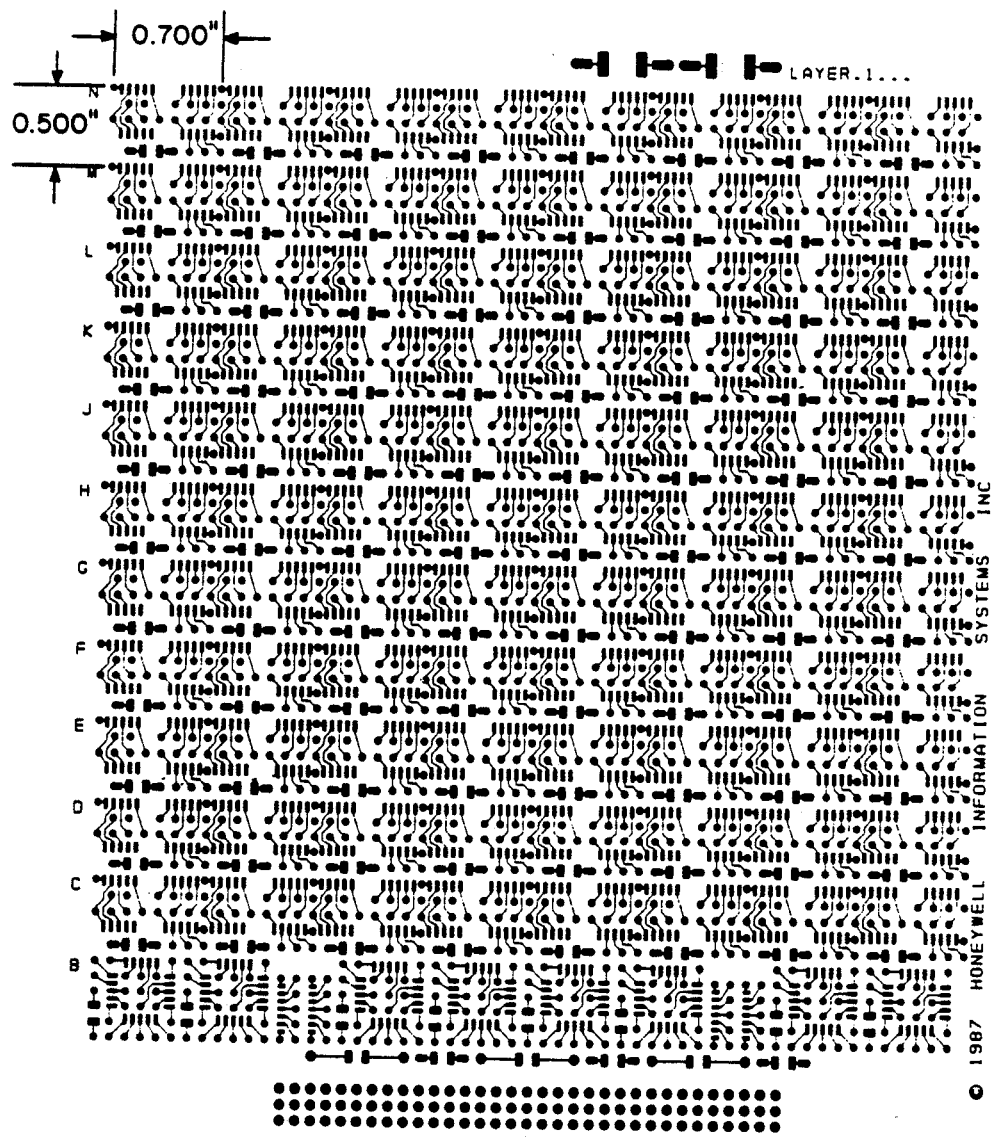
Figure 3:
FIG. 3 shows the bottom artwork pattern for producing the multilayer board of FIG. 1.

According to the present invention, the top and bottom layers are constructed from the artwork patterns of FIGS. 2 and 3. As seen from these Figures, both top and bottom layers include a minimum pattern which is repeated horizontally and vertically. This results in the array patterns consisting of rows C through N shown in FIGS. 2 and 3. When the patterns of FIGS. 2 and 3 are compared, it will be noted that the top and bottom patterns are mirror images of each other. As explained herein, the IC components soldered onto the top and bottom layers are interconnected as duplicate pairs as discussed herein.

Figure 4:
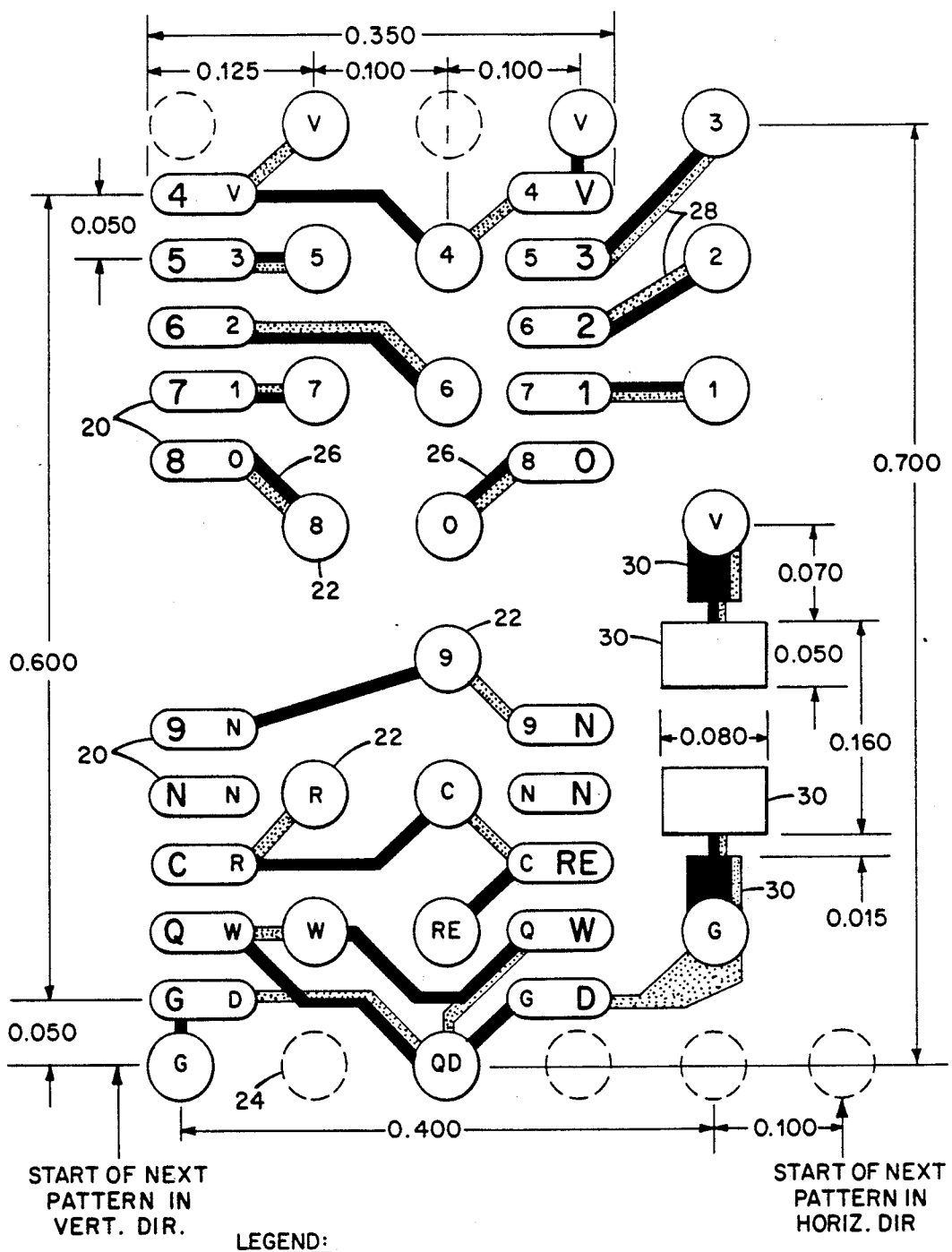
FIG. 4 shows the cell pattern used to produce the patterns of FIGS. 2 and 3.

The minimum repeatable pattern for the top and bottom layers is shown in FIG. 4. In the Figure, the larger size numbers and letters contained in the elliptical-shaped elements, such as 20, designate the pin/signal assignments for the electrical components mounted on the top surface of board 10. The smaller size numbers and letters contained in the same elliptical-shaped elements designate the signal assignments for corresponding components mounted on the bottom surface of board 10. The solid circles, such as 22, correspond to plated through holes contained in board 10. The dotted circles, such as 24, denote the start of the next minimum pattern. As indicated, the minimum pattern is repeated vertically and horizontally every 0.700 and 0.500 inches. This can be better seen from FIGS. 2 and 3.

The heavy solid lines in FIG. 4, such as lines 26, denote the printed wiring connections contained on the top surface of board 10. The dotted filled line areas, such as lines 28, denote the printed wiring connections contained on the bottom surface of board 10. The square-shaped elements, such as 30, denote filter capacitor pads.

The specific pattern of FIG. 4 includes the surface mounting pads and signal connections for two DRAM IC chips and two filter capacitors. The two DRAM IC chips and the filter capacitors are mounted on each side of board 10. The specific pattern is used for mounting the DRAM chip package shown in FIG. 5.

Figure 5:
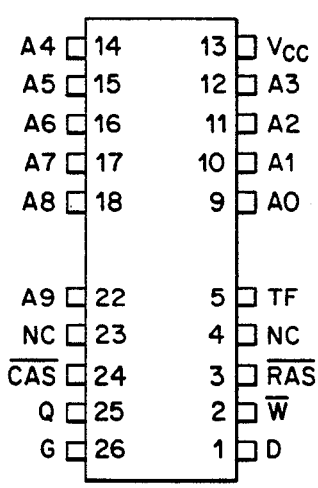
FIG. 5 is a top view of a DRAM integrated 25 circuit package of the IC components which populate the multilayer printed circuit board of FIG. 1.
Figure 6:
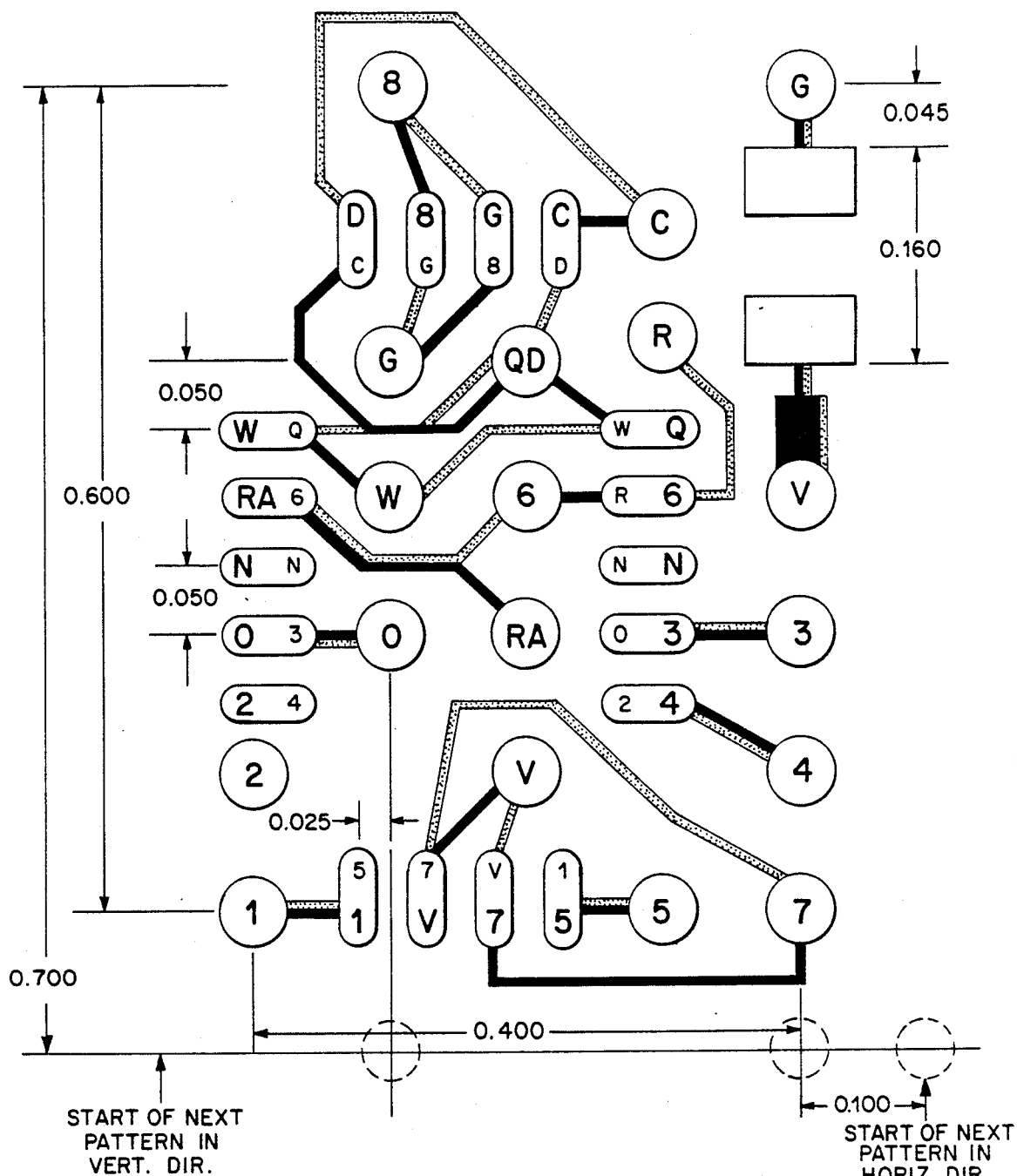
FIG. 6 shows another cell pattern which can be used to produce patterns similar to those of FIGS. 2 and 3.

The DRAM chip package contains a 1-megabit DRAM device of the type designated as TMS4C1027, manufactured by Texas Instruments Inc. In FIG. 5, the pad marked "D" corresponds to pin 1 of the DRAM chip package of FIG. 5. FIG. 6 shows the minimum repetitive pattern for a different shaped IC element, such as the DRAM chip package shown in FIG. 7. The package contains a 256K DRAM device of the type designated as TMS4256 manufactured by Texas Instruments Inc. The minimum repetitive pattern is repeated horizontally and vertically to produce artworks similar to those shown in FIGS. 2 and 3. In FIG. 6, the pad marked "8" corresponds to pin 1 of the package of FIG. 7.

According to the present invention, specific logically equivalent signals are exchanged so as to simplify the top and bottom layer connections as follows. That is, the invention recognizes that relative to the operation of a DRAM chip, the address signals designated on opposite sides of the package may be treated as logic equivalents. This means that the address signals in FIG. 5 applied to pins 9 and 18, 10 and 17, 11 and 16 and 12 and 15 can be exchanged. This exchanging takes advantage of an operational characteristic of DRAM devices which allows the scrambling of input address signals without affecting normal chip operation. That is, as long as each input address pin is connected to receive a unique address bit, the DRAM device will still operate properly.

As seen from FIG. 4, by exchanging the above address signals, sets of chip address pins from top and bottom DRAM devices can be connected to the same holes positioned between or to the right side of the elliptical-shaped pads by short conductor lines. In the case of the top DRAM chip device of each pair, the input address signals A0 through A8 and A9 applied via input connector 14 are wired to pins 9–18 and 22 respectively which have the same address signal designations.

However, the bottom DRAM chip device of each pair has the address input signals A0 through A3 wired to pins 18–15, respectively, and address input signals A5 through A8 wired to pins 12–9 respectively. For the reasons mentioned, this reassignment of address inputs does in no way affect the operation of the bottom DRAM chip devices. The address bit signal designations of the bottom DRAM chip devices are renamed or relabeled to conform to the address bit signal designations of the top DRAM chip devices as denoted by the number shown in the plated through hole of FIG. 4 (e.g. "8" in circle labeled 22).

The multilayer printed circuit board 10 is fabricated using the top and bottom artworks of FIGS. 2 and 3 as well as six other artworks for the internal layers. As is well known, a multilayer printed circuit board comprises several layers of printed wiring patterns, each mounted on a thin layer of insulating material and carefully aligned and molded together. Essentially, the board can be viewed as consisting of layers formed by a number of single sided and double sided printed circuit boards, each of which consist of a substrate material to which a thin laminate of conductive material, such as copper alloy, is bonded to one side.

Utilizing conventional photographic techniques, the copper sides of the boards are photographed utilizing the appropriate artworks. That is, photosensitive material is applied to the copper laminate and the transparency of the circuit artwork is accurately positioned relative to the board. Next, the board layer is photographed and the image is developed utilizing techniques similar to those required to produce a snapshot or film. Then the boards are subjected to chemicals which etch away the copper in the exposed areas or unexposed areas the process to form the patterns of conductors and pads including pads encompassing holes previously drilled through the board.

As previously discussed, the plated through holes are placed on the grid which provides a separation distance of 0.100 inch between hole centers. Typically, the holes are 23 mils while the pads are 43 mils. The bottom pad board layer is photographed utilizing the artwork of FIG. 3. The intermediate board layers may also include plated through holes (buried vias) for making required internal connections. In the preferred embodiment, the second, third, sixth and seventh layers as used to transfer signals while the fourth and fifth layers provide ground and voltage planes. These layers generally include patterns of parallel lines.

Following the molding of the several board layers, a solder paste is screened onto the component pad patterns of the board. The DRAM devices and other components (e.g. capacitors) are then placed on the surface of the top layer. The board is next heated in an infrared heater which reflows the solder paste. This connects the pins of the DRAM devices to the elliptical-shaped pads. The corresponding DRAM devices are placed on the bottom layer surface and the soldering step is repeated.

From the foregoing, it is seen how the present invention provides for the fabrication of high density memory boards. It also allows the use of testing equipment which i used for testing standard multilayer boards. The pattern is repeated so as to provide a spacing which facilitates board inspection for solder defects and board repairs with no increase from the standard multilayer board size. Moreover, while the preferred embodiment includes eight layers, it is possible to use less layers to provide the required interconnections without having to employ fine line process techniques in the construction of the signal layers.

It will be appreciated that many modifications may be made to the preferred embodiment of the present invention. For example, as described above, the teachings of the present invention may be used in conjunction with other types of DRAM devices. Also, the teachings are applicable to other types of IC packages which can be mounted on a board surface using repeatable patterns.

While in accordance with the provisions and statutes there has been illustrated the best form of the invention known, certain changes may be made to the system described without departing from the spirit of the invention as set forth in the appended claims and, in some cases, certain features of the invention may be used to advantage without a corresponding use of other features.

What is claimed is:

1. A multilayer printed circuit board for mounting a plurality of integrated circuit packages containing devices, each having a plurality of input pins for receiving a corresponding number of signals, said board comprising:

a top layer, a bottom layer and a number of intermediate layers, said top and bottom layers having repetitive patterns of pads which are mirror images of each other, each of said pad patterns including pads for plated through holes contained in said circuit board with a predetermined spacing between the centers of said holes;

a plurality of conductors of minimum length connecting predetermined ones of said pads to said plated through hole pads on said top and bottom layers of said board so that a plurality of said plated through holes are connected by corresponding ones of said conductors to be shared between corresponding integrated circuit packages mounted on said top and bottom layers; and, said plurality of said integrated circuit packages being mounted on said pads on said top and bottom layers of said board in a paired fashion for enabling an exchange of input pin signal assignments based upon an operational characteristic of said devices included in said packages so as to reduce the number of plated through holes.

2. The board of claim 1 wherein said devices are high density DRAM integrated circuits.

3. The board of claim 2 wherein each of said DRAM integrated circuits have a storage capacity of 1 megabits × 1 bit.

4. The board of claim 1 wherein a plurality of said input signals are address signals and wherein said operational characteristic of said devices is such that said address signals applied to said input pins by said pads can be reassigned without interferring with the normal operation of said devices included in said plurality of integrated circuit packages.

5. The board of claim 1 wherein a substantially equal number of said plated through holes in said board are distributed in rows so as to simplify internal connections.

6. The board of claim 5 wherein said rows of holes are separated by a predetermined spacing selected to permit the use of standard test equipment.

7. The board of claim 6 wherein said predetermined spacing is one hundredths of an inch from center to center.

8. The board of claim 1 wherein said board is of multilayer construction and pairs of said plurality of integrated circuit packages are mounted in the same positions above and below one another respectively on said top and bottom layers of said board using surface mount construction.

9. The board of claim 1 wherein said repetitive pattern of pads is repeated to provide a spacing for facilitating access to check for defects.

10. A multilayer printed circuit board for mounting a plurality of integrated circuit packages for housing a corresponding number of high density storage devices, each having a plurality of input pins for receiving a corresponding number of signals, said board comprising:

a top layer surface and a bottom layer surface, said top and bottom layer surfaces having repetitive patterns of pads which are mirror images of each other, each of said pad patterns including pads for mounting said integrated circuit packages and pads associated with plated through holes contained in said circuit board with a predetermined spacing between the centers of said holes;

a plurality of wiring conductors connecting predetermined ones of said mounting pads to said plated through hole pads on said top and bottom layer surfaces of said board so that a plurality of said plated through holes are connected by corresponding ones of said conductors to be shared between corresponding integrated circuit packages mounted on said top and bottom layer surfaces; and, said plurality of said integrated circuit packages being mounted on said mounting pads on said top and bottom layer surfaces of said board in a paired fashion occupying like positions for enabling an exchange of input pin signal assignments based upon a predetermined operational characteristic of said storage devices so as to reduce to a minimum, the number of said plated through holes.

11. The board of claim 10 wherein said devices are high density DRAM integrated circuits.

12. The board of claim 11 wherein each of said DRAM integrated circuits have a storage capacity of 1 megabits × 1 bit.

13. The board of claim 10 wherein a plurality of said input signals are address signals and wherein said operational characteristic of said devices is such that the said address signals applied to said input pins by said pads can be reassigned without interferring with the normal operation of said devices.

14. The board of claim 10 wherein a substantially equal number of said plated through holes included in said board are distributed in rows so as to simplify internal connections.

15. The board of claim 14 wherein said rows of holes are separated by a predetermined spacing selected to permit the use of standard test equipment.

16. The board of claim 15 wherein said predetermined spacing is one hundredths of an inch from center to center.

17. The board of claim 10 wherein said board is of multilayer construction and said plurality of integrated circuit packages are mounted above and below one another in said positions on said top and bottom surfaces of said board using surface mount construction.

18. The board of claim 10 wherein said repetitive pattern of pads is repeated to provide a predetermined spacing between successive repetitive patterns for facilitating access to check for defects.

* * * * *